United States Patent [19]

Kimura et al.

[11] Patent Number: 5,030,373

[45] Date of Patent: Jul. 9, 1991

[54] SURFACE-TREATING AGENTS FOR COPPER AND COPPER ALLOY

[75] Inventors: Toshiya Kimura; Koichi Wakashima, both of Shimonikawa; Hidebumi Ohnuki, Sagamihara; Shigeki Nakajima, Shimonikawa; Katsutoshi Itani; Akira Hirai, both of Fuji, all of Japan

[73] Assignee: Tokai Denka Kogyo Kabushiki Kaisha, Tokyo, Japan

[21] Appl. No.: 490,719

[22] Filed: Mar. 8, 1990

[30] Foreign Application Priority Data

Mar. 8, 1989 [JP] Japan .................................. 1-53800

[51] Int. Cl.$^5$ ................................................ B08B 3/08
[52] U.S. Cl. .................................. 252/79.4; 252/79.2; 156/666; 156/903
[58] Field of Search ................... 252/79.1, 79.2, 79.4; 156/903, 664, 666

[56] References Cited

U.S. PATENT DOCUMENTS

| | | | |
|---|---|---|---|
| 4,040,863 | 8/1977 | Kitamura | 134/3 |
| 4,636,368 | 1/1987 | Pralus | 134/6 X |
| 4,929,301 | 5/1990 | Beechko | 252/79.4 X |

FOREIGN PATENT DOCUMENTS 53-32339  9/1978  Japan .
53-32340  9/1978  Japan .

OTHER PUBLICATIONS

Hoeg et al., "Metallic Free Organic Aluminum Etchant", IBM Tech. Discl. Bulletin, vol. 15, No. 1, Jun. 1972.

Primary Examiner—David A. Simmons
Assistant Examiner—Thi Dang
Attorney, Agent, or Firm—Scully, Scott, Murphy & Presser

[57] ABSTRACT

An aqueous solution containing 0.1 g/l or more of piperidine or a derivative, 100–500 g/l of sulfuric acid, 10–50 g/l of hydrogen peroxide and 0.5 g/l or more of phosphoric acid is used for treating the surface of copper or copper alloy used in manufacturing of printed circuit.

3 Claims, No Drawings

SURFACE-TREATING AGENTS FOR COPPER AND COPPER ALLOY

BACKGROUND OF THE INVENTION

This invention relates to surface-treating agents for copper and copper alloy which are used in manufacturing of printed circuit.

Recently, printed circuit has become increasingly important as packaging parts while steadily and step by step overcoming technical obstacles produced by development of smaller, lighter and more multifunctional electronic instruments. With the progress of automation of the package of electronic instruments, lines of the print circuit have been finer, the holes smaller in diameter, and the system more multilayered, and technical improvement of the formation of so-called high density circuit is more and more desired.

In association with the development of high density printed circuit, steps for applying various platings such as electroless copper plating subsequent to various processings of the copper-plated laminate have increased.

Thus, so-called soft etching step for (1) removal of the anticorrosive and the oxide film remaining on the surface of copper foil of the copper-plated laminate (2) roughing of the copper surface for activating the copper surface and improving adherence of the plating, (3) removal of the flaws formed on the processed surface, etc. plays an important role.

Furthermore, due to the development of finer patterns of printed circuit, mechanical or pamis polishing heretofore employed has become technically difficult, and substitution of the polishing with chemical cleaning is desired.

Heretofore, ammonium persulfate or sodium persulfate is used as the soft etching agent. Ammonium persulfate, however, is defective in that copper ammonium complex is formed during neutralization due to co-existence of ammonium ions in the effluent, and copper in the wastewater cannot be removed.

Sodium persulfate also needs various measures for improving performance which is inferior to that of ammonium persulfate. In addition, there are such disadvantages as short life, frequent bathings and high cost for manufacturing in the etching solution using ammonium persulfate or sodium persulfate.

Application of soft etching with an acid aqueous solution of hydrogen peroxide has the heretofore been attempted in order to overcome such disadvantages. However, the prior-art acid aqueous solutions of hydrogen peroxide are encountered with problems as follows:

(1) Two-step treatment involving soaking aftertreatment with diluted sulfuric acid or diluted hydrochloric acid is required due to formation of oxide film on the copper surface after soft etching.

(2) Rate of dissolving copper is apt to be influenced by the change of hydrogen peroxide concentration in the etching solution so that finish of the copper surface is not uniform.

(3) Adherence of the plating is inferior as compared with soft etching with ammonium persulfate.

Polishing with an acid hydrogen-peroxide system has been proposed as a chemical polishing substitution for the mechanical polishing as mentioned above. In general, however, this process needs a two-step treatment in which oxide film is first formed with hydrogen peroxide and sulfuric acid and then the oxide film is removed with a diluted aqueous solution of an acid. Improved one-step chemical polishing methods by addition of phosphoric acid and an amine are proposed in Japanese Patent Publication Nos. 32339/1978 and 32340/1978. These methods are not adaptable to use in the high-density printed circuit because of such disadvantages that they are not economical due to high hydrogen-peroxide concentration of 5%–60% and even the addition of phosphoric acid and an amine cannot lead to complete removal of the oxide film.

SUMMARY OF THE INVENTION

It is the object of the invention is to overcome the above mentioned problems.

As a result of studies in order to improve the methods as mentioned above we have found that addition of an adequate amount of piperidine or a derivative thereof to an aqueous solution of hydrogen peroxide consisting essentially of hydrogen peroxide, sulfuric acid and phosphoric acid achieves such improvement.

Thus, the invention is directed to a surface-treating agent for copper and copper alloy comprising 0.1 g/l or more of piperidine or a derivative thereof being contained in an acid aqueous solution of hydrogen peroxide consisting essentially of 100–500 g/l of sulfuric acid, 10–50 g/l of hydrogen peroxide and 0.5 g/l or more of phosphoric acid.

DETAILED DESCRIPTION OF THE INVENTION

The copper or copper alloy treated with the surface-treating agent of the invention forms no oxide film on the surface with a result that aftertreatment of removing the oxide film needed in the prior-art methods can be omitted as well as excellent performance such as superior adherence of the plating and wettability and brightness of the solder is produced.

Phosphoric acid when used in the invention is effective in inhibiting formation of the oxide film by the addition in an amount of 0.5 g/l or more. Particularly, the addition in the range between 2 and 5 g/l is preferred. The addition of 5 g/l or more is also effective, and no upper limit is required to be set. Too much amount is unfavorable in economical consideration. Although addition of 0.5 g/l or more of phosphoric acid is effective in inhibiting formation of the oxide film, use of an aqueous solution of hydrogen peroxide composed only of sulfuric acid, hydrogen peroxide and phosphoric acid cannot reach omission of the oxide film-removing step.

The first feature of the invention is based upon the finding that piperidines produce peculiar result of completely inhibiting the oxide film.

Moreover, the result is not produced by the combination of piperidine with sulfuric acid and hydrogen peroxide but first developed by further addition of phosphoric acid.

The piperidine or a derivative thereof is added in an amount of 0.1 g/l or more. Addition of an amount less than 0.1 g/l is unfavorable because the oxide film will then be formed. Preferred amount of the addition is in the range between 0.1 and 5 g/l. The addition of an amount more than 5 g/l is unfavorable because surface finish of the copper or copper alloy will occasionally lose brightness.

Particular examples of the piperidine or its derivative include piperidine, 2-pipecoline, 3-pipecoline, 4-pipecoline, 2,6-lupetidine, 3,5-lupetidine, 3-piperidinemethanol, pipecolic acid, isonipecotic acid, methyl isonipecotate, ethyl isonipecotate and the like. They can be used either alone or in combination of two or more.

The surface-treating agent of the invention may contain other appropriate additives as needed. Particular examples of the additive include alcohols, phenols, glycol ethers and the like known as a stabilizer for hydrogen peroxide. The surface-treating agent of the invention is not adversely affected by the addition by these additives.

The surface-treating agent of the invention is also characterized by applicability to a wide range of the steps for manufacturing printed circuit as follows: (1) Primary copper-plating pretreatment, (2) secondary copper-plating pretreatment, (3) pretreatment for the photo printing, (4) pretreatment for solder resist printing, (5) pretreatment for the solder coating step, (6) finishing treatment and (7) chemical treatment substitution for mechanical polishing.

Liquid temperature in using the surface-treating agent of the invention is generally 50° C or below and preferably in the range between 30 and 40° C. A temperature above 50° C is unfavorable because extensive decomposition of the hydrogen peroxide will cause difficulty in controlling liquid.

Application for the surface-treating agent may be made by a known means such as soaking or spraying.

The invention will be described with reference to examples below but is not intended to be limited thereto.

EXAMPLE 1

Surface-treating agents were prepared by adding a piperidine as an additive to an aqueous solution composed of 200 g/l of sulfuric acid, 35 g/l of hydrogen peroxide and 2 g/l of phosphoric acid.

Test pieces were prepared by cutting a glass-epoxy copper-plated laminate with a thickness of the copper of 35 $\mu$ into pieces of a size of 5cm×5cm.

In a beaker was placed 400 ml of the surface-treating agent thus prepared, in which was soaked the test piece for 2 min. while keeping the temperature at 35° C. Immediately after the soaking the test piece was washed with water and air dried. The presence or absence of the oxide film on and finish of the copper surface were examined.

The same tests were run with addition of a substance other than piperidines for comparison. The results are shown in Table-1.

TABLE 1

|  | Amount Added | Formation of Oxide Film | Finish of the Surface |
|---|---|---|---|
| The Invention | | | |
| Piperidine | 1 g/l | None | ⊙ |
| 2-pipecoline | 0.1 g/l | None | ○ |
| 2-pipecoline | 1 g/l | None | ⊙ |
| 2-pipecoline | 5 g/l | None | ⊙ |
| 2-pipecoline | 10 g/l | None | ○ |
| 2,4-lupetidine | 1 g/l | None | ⊙ |
| 3-piperidine-methanol | 1 g/l | None | ⊙ |
| Pipecolic acid | 1 g/l | None | ⊙ |
| Isonicopetic acid | 1 g/l | None | ⊙ |
| Comparative Example | | | |
| None | — | Some | X |
| Monoethylamine | 1 g/l | Slight | ○ |
| Imidazole | 1 g/l | Slight | ○ |
| Benztriazole | 1 g/l | Some | X |
| Piperazine | 1 g/l | Some | X |
| 5-amino-1H-tetrazole | 1 g/l | Some | X |
| Pyrrolidine | 1 g/l | Slight | ○ |
| Pyridine | 1 g/l | Slight | ○ |

Finish of the surface:
Smooth and bright ... ⊙
Slightly bright ... ○
Poor finish and discolored ... X

EXAMPLE 2

Surface-treating agents were prepared from an aqueous solution composed of 200 g/l of sulfuric acid and 35 g/l of hydrogen peroxide in the presence or absence of piperidine and phosphoric acid added. The copper surface after the same surface treatment as in Example 1 was evaluated. The results are shown in Table-2.

TABLE 2

|  | Amount of Piperidine Added | Formation of Oxide Film | Finish of the Surface |
|---|---|---|---|
| No piperidine added | No phosphoric acid added | Some | X |
|  | Phosphoric acid 2 g/l | Slight | ○ |
| Piperidine 1 g/l | No phosphoric acid added | Slight | ○ |
|  | Phosphoric acid 0.5 g/l | None | ⊙ |
|  | Phosphoric acid 1 | None | ⊙ |
|  | Phosphoric acid 2 | None | ⊙ |
|  | Phosphoric acid 10 | None | ⊙ |

EXAMPLE 3

Surface-treating agents were prepared from an aqueous solution containing sulfuric acid and hydrogen peroxide in varied concentrations by adding 2 g/l of phosphoric acid and 1 g/l of piperidine. Surface treatment was carried out by the same procedures as in Example 1, and states of the oxide film on the surface and the finish were collectively evaluated. The results are shown in Table-3.

TABLE 3

| $H_2SO_4$ Concentration | $H_2O_2$ Concentration | | | | | |
|---|---|---|---|---|---|---|
|  | 5 g/l | 10 g/l | 30 g/l | 50 g/l | 70 g/l | 100 g/l |
| 50 g/l | Poor | Poor | Poor | Poor | Poor | Poor |
| 100 | Poor | Good | Good | Good | Fair | Poor |
| 200 | Poor | Good | Good | Good | Fair | Poor |
| 300 | Poor | Good | Good | Good | Fair | Fair |
| 400 | Poor | Good | Good | Good | Fair | Fair |
| 500 | Poor | Good | Good | Good | Fair | Fair |
| 600 | Poor | Fair | Fair | Fair | Fair | Fair |

Evaluation of the copper surface
Good: Smooth and bright, no oxide film
Fair: Somewhat inferior brightness, no oxide film
Poor: Poor finish, some oxide film

EXAMPLE 4

A surface-treating agent was prepared from an aqueous solution composed of 200 g/l of sulfuric acid, 35 g/l of hydrogen peroxide, 2 g/l of phosphoric acid and 2 g/l of pipecoline in which 5 g/l of monobutyl cellosolve was added as a stabilizer. In the solution was soaked a glass-epoxy copper-plated laminate which had been defatted at 35° C. for 2 min. immediately followed by washing with water and drying. The resulting copper surface was good without oxide film formed. Without the addition of pipecoline there remained oxide film on the treated copper surface.

The surfaces were subjected to electroless copper plating to 3 μ and then to copper electroplating to 35 μ, washed with water and dried. The product from the pipecoline addition was superior in adherence strength to the product treated without the pipecoline addition.

EXAMPLE 5

A surface-treating agent was prepared from an aqueous solution composed of 200 g/l of sulfuric acid, 35 g/l of hydrogen peroxide, 2 g/l of phosphoric acid and 2 g/l of piperidine in which 5 g/l of monobutyl cellosolve was added as a stabilizer. In the solution was soaked a glass-epoxy copper-plated laminate which had been defatted at 30° C. for 1 min. immediately followed by washing with water, catalyst treatment and accelerator treatment. The surfaces were subjected to electroless copper plating to 0.3 μ and then to copper electroplating to 25 μ. The adherence was examined by the burner lignition test to find that it was equivalent to that of the product from the treatment with 150 g/l of ammonium persulfate.

What is claimed is:

1. A surface-treating agent for copper and copper alloy comprising 0.1 g/l or more of piperidine or a derivative thereof being contained in an acid aqueous solution of hydrogen peroxide consisting essentially of 100–500 g/l of sulfuric acid, 10–50 g/l of hydrogen peroxide and 0.5 g/l or more of phosphoric acid.

2. A surface-treating agent according to claim 1 wherein content of the piperidine or derivative thereof is 0.1–5 g/l.

3. A surface-treating agent according to claim 1 wherein said piperidine or its derivative is 2-pipecoline, 3-pipecoline, 4-pipecoline, 2,6-lupetidine, 3,5-lupetidine, 3-piperidinemethanol, pipecolic acid, isonipecotic acid, methyl isonipecotate or ethyl isonipecotate.

* * * * *